(12) United States Patent
Küchler et al.

(10) Patent No.: US 7,207,030 B2
(45) Date of Patent: Apr. 17, 2007

(54) METHOD FOR IMPROVING A SIMULATION MODEL OF PHOTOLITHOGRAPHIC PROJECTION

(75) Inventors: Bernd Küchler, Dresden (DE); Ralf Ziebold, Radebeul (DE); Christoph Nölscher, Dresden (DE)

(73) Assignee: Infineon Technologies AG, Munich (DE)

( * ) Notice: Subject to any disclaimer, the term of this patent is extended or adjusted under 35 U.S.C. 154(b) by 324 days.

(21) Appl. No.: 10/995,126

(22) Filed: Nov. 24, 2004

(65) Prior Publication Data
US 2005/0114823 A1   May 26, 2005

(30) Foreign Application Priority Data
Nov. 26, 2003   (DE) ................. 103 55 264

(51) Int. Cl.
*G06F 17/50* (2006.01)
(52) U.S. Cl. ............... 716/21; 716/19; 716/20
(58) Field of Classification Search .......... 716/19–21; 430/5; 703/6
See application file for complete search history.

(56) References Cited

U.S. PATENT DOCUMENTS

| 6,049,660 A | 4/2000 | Ahn et al. |
| 2002/0018599 A1 | 2/2002 | Kamon |
| 2003/0236653 A1* | 12/2003 | Zinn ............ 703/6 |

* cited by examiner

*Primary Examiner*—Vuthe Siek
(74) *Attorney, Agent, or Firm*—Edell, Shapiro & Finnan LLC

(57) ABSTRACT

A method is provided for improving a photolithographic simulation model of the photolithographic simulation of a pattern formed on a photomask. Proceeding from a two-dimensional simulation model that takes account of the physical-chemical processes during lithography, a frequency-dependent intensity loss is calculated which is determined by multiplication of the simulated intensity distribution in the Fourier space by a filter function. An accurate calculation of the intensity distribution in the substrate plane is obtained. This method achieves the accuracy of three-dimensional models with a significantly shorter processing duration and is further suitable in particular for the calculation of OPC structures.

10 Claims, 2 Drawing Sheets

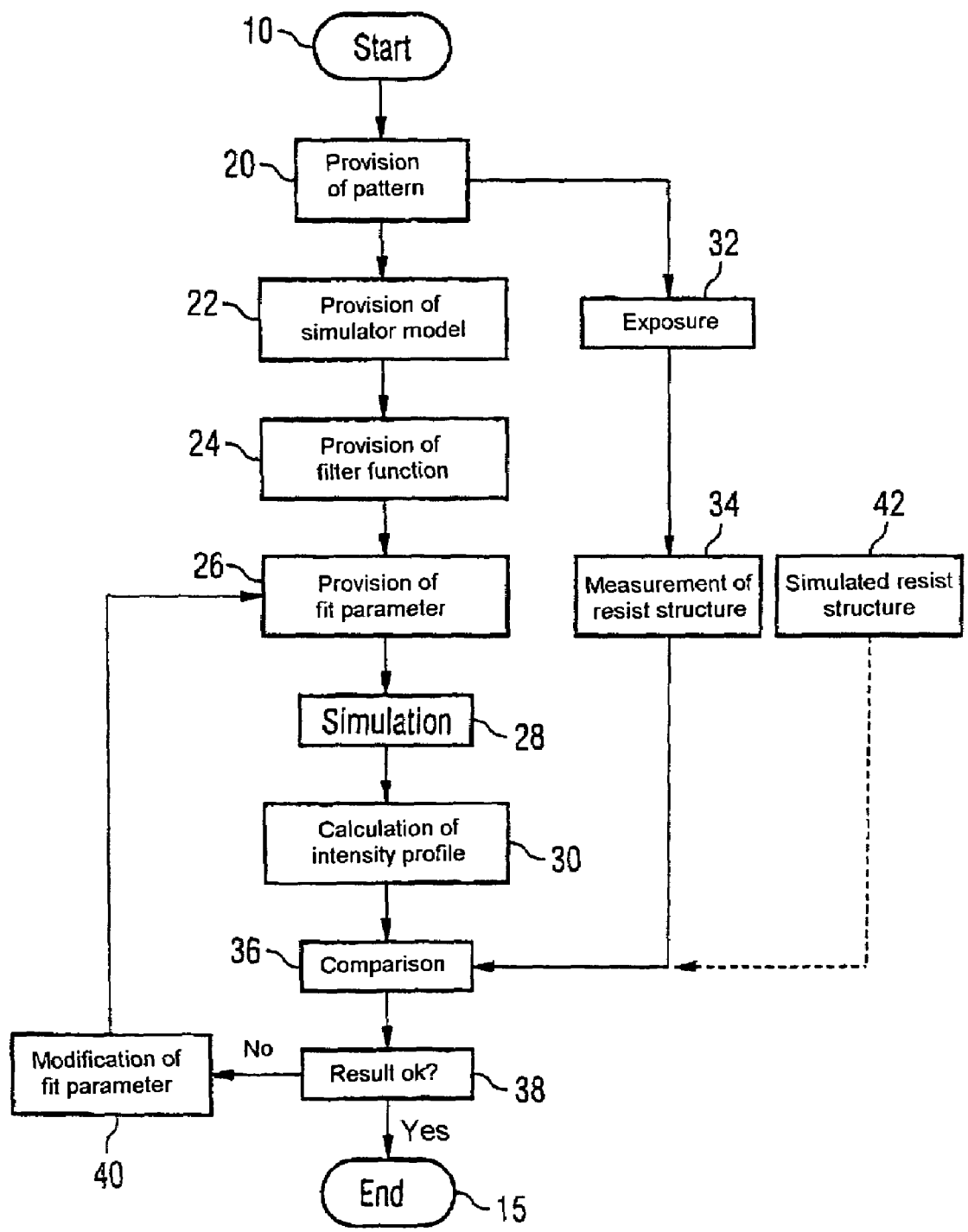

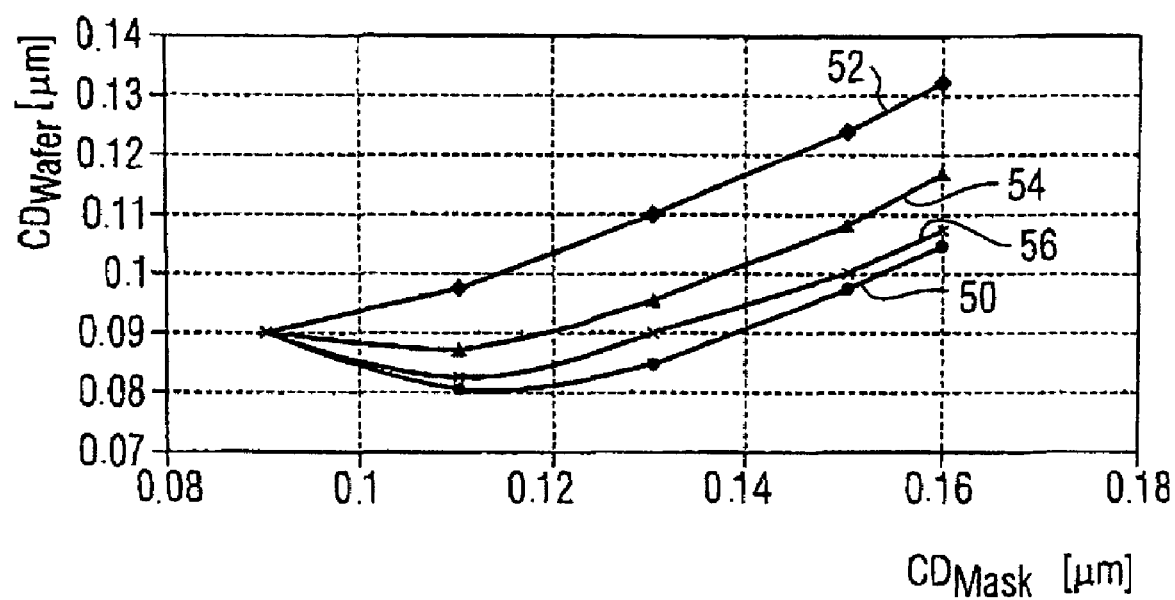

METHOD FOR IMPROVING A SIMULATION MODEL OF PHOTOLITHOGRAPHIC PROJECTION

CROSS REFERENCE TO RELATED APPLICATIONS

This application claims priority under 35 USC §119 to German Application No. DE 103 55 264.2, filed on Nov. 26, 2003, and titled "Method for Improving a Simulation Model of Photolithographic Projection," the entire contents of which are hereby incorporated by reference.

FIELD OF THE INVENTION

The invention relates to a method for improving a simulation model of the photolithographic projection of a pattern formed on a photomask onto a substrate of a semiconductor wafer.

BACKGROUND

For the fabrication of integrated circuits, layers provided with different electrical properties are usually applied on semiconductor wafers and in each case patterned lithographically. A lithographic patterning step may consist in applying a photosensitive resist, exposing the latter with a desired structure for the relevant plane and developing it, and then transferring the resultant resist mask into the underlying layer in an etching step.

For the lithographic projection step of a circuit pattern, a wafer scanner or wafer stepper is usually used as exposure apparatus. In the exposure apparatus, the photosensitive resist is exposed with electromagnetic radiation having a predetermined wavelength, for example lying in the UV range.

Each individual layer of the circuit pattern is usually imaged onto the semiconductor wafer using a special mask (also called reticle) and a projection optical arrangement. The reticle comprises a substrate layer provided with absorbent elements, such as e.g. a chromium layer, which simulate the circuit pattern. The projection optical arrangement of the exposure apparatus often contains a plurality of lenses and diaphragms and often reduces the circuit pattern during transfer onto the resist layer.

Dense line-gap patterns such as are formed for instance in the field of fabricating dynamic random access memories have feature sizes of 70, 90 or 110 nm, by way of example. During the process of lithographic exposure of such a pattern, wavelengths of 248 nm or 193 nm are used nowadays in the exposure apparatuses.

The structure resolution that can be achieved is influenced by a plurality of factors. In this case, it has been found, inter alia, that densely packed structures are imaged onto the resist layer with a different linewidth than isolated or semi-isolated structures. Furthermore, a shortening of lines to be imaged at their ends and also an altered linewidth are observed. In order to minimize the inaccuracies resulting from these effects during lithographic projection, critical structure elements are often provided with so-called OPC structures. OPC structures (OPC=optical proximity correction) alter the form or dimensions of specific structure elements at specific locations of the circuit pattern, or are additional structures that are not imaged in the photoresist.

In order to determine the OPC structures, the circuit pattern is usually calculated using a simulation model of the photolithographic projection which results during imaging onto the resist layer of the semiconductor wafer. A simulation model that calculates the physical-chemical processes during lithography by means of a two-dimensional model is often used for this purpose. These calculations have to be executed for virtually the entire area of the reticle in order to be able to calculate the OPC structures for the entire chip to be fabricated.

It has been shown, however, that the two-dimensional models often used are beset by errors since important physical effects cannot be taken into account on the basis of the two-dimensional consideration.

In recent years lithographic simulation has implemented refined, but more complex computational methods that enable physical-chemical processes in lithographic technology to be modeled and calculated as closely to reality as possible. Small regions of the reticle can be simulated accurately by means of these complex simulations. These simulation models cannot be used for a large-area application since the required computation times would be orders of magnitude too long. Examples of accurate simulation models are the so-called transfer matrix model and other three-dimensional simulation models.

SUMMARY OF THE INVENTION

It is an object of the invention to provide a method that improves a simplifying photolithographic simulation model in such a way that the aforementioned problems are overcome.

In accordance with the present invention, a method for improving a photolithographic simulation of the projection of a pattern of structure elements formed on a photomask onto a substrate comprises providing a pattern, providing a simplifying simulation model that describes the physical or chemical processes during lithography with an exposure apparatus without taking account of frequency-dependent transmissions of different orders of diffraction, executing a simulation of the projection of the pattern onto a resist layer applied on a substrate of a semiconductor wafer in the exposure apparatus for the purpose of forming a patterned resist layer with the simulation model, calculating an intensity distribution in the substrate plane in a two-dimensional simulation of the imaging of the pattern with calculation of an intensity distribution in the Fourier space, proving a two-dimensional filter function, calculating a frequency-dependent intensity loss during the step of simulation of the pattern by multiplication of the intensity distribution in the Fourier space by the filter function in order to achieve a matching of the simulation result of the simulation model with a more exact simulation that takes account of the frequency-dependent transmission of different orders of diffraction, and optimizing the geometry of the structures of the pattern and/or parameters of the lithographic projection in order to achieve an improved dimensional accuracy for subsequent imagings.

The method according to the invention is distinguished by the fact that, as the grating constant decreases (which corresponds to a higher spatial frequency of the mask structures), it is possible to take account of a reduced transmission for different frequencies. As a result, effects that cannot be taken into account in a simplified, two-dimensional simulation model (e.g., oblique incidence of the light and associated angle- and polarization-dependent reflection of orders of diffraction) can now be taken into account even though they are actually fully accessible only to a three-dimensional simulation.

In one preferred embodiment of the method, the simulation of the photolithographic projection is effected on the basis of a model with a plurality of coupled parameters.

In accordance with this procedure, it is possible to use a very fast and efficient calculation method for two-dimensional simulation.

In a further preferred embodiment of the method, moreover, the resist layer that is patterned during exposure is measured and the filter function is selected in such a way that it has at least one fit parameter, the fit parameter being chosen in such a way that the simulated intensity distribution corresponds to the measured spacings of the resist structure.

In accordance with this procedure, it is possible, by way of example, in the OPC process flow for the calculation of OPC structures, for the filter function used to be adapted to measured resist structures, i.e. to be calibrated, thus resulting in an optimum correspondence. In this case, the fit parameter is manifested as a further parameter in the adaptation of the simulation model to the real conditions and can thus likewise be optimized during a calibration of the simulation model in addition to the customary parameters such as e.g. resist contrast.

In accordance with a further preferred embodiment of the method, the filter function has the form of a Gaussian function, the half value width of the Gaussian function corresponding to the fit parameter and being determined by measurement of the resist layer.

In accordance with this procedure, the fit parameter can be adapted in a simple manner without having to perform complicated calculations for this purpose.

In a further preferred embodiment of the method, the filter function is determined by means of a simulated resist structure.

In accordance with this procedure, the fit parameter of the filter function can be adapted without having to carry out an actual exposure of a resist layer.

The above and still further objects, features and advantages of the present invention will become apparent upon consideration of the following detailed description of specific embodiments thereof.

BRIEF DESCRIPTION OF THE DRAWINGS

FIG. 1 schematically shows the sequence of a calibration method according to the present invention on the basis of a flow diagram.

FIG. 2 shows a diagram of measured and simulated feature sizes that are used for optimizing a method according to the present invention.

DETAILED DESCRIPTION

In accordance with the present invention, an OPC process flow for the calculation of OPC structures of a circuit pattern is described below. An optimization of the geometry of the mask structures and, if appropriate, of further lithography parameters is usually carried out in the OPC process flow. However, the method according to the invention is also suitable for other calculations that require a simulation of a large-area circuit pattern.

FIG. 1 shows an embodiment of the method according to the invention in the form of a flow diagram. OPC structures serve for altering the linewidth of specific structure elements of the circuit pattern, so that it is possible to compensate for specific imaging errors during the transfer of the circuit pattern into a resist layer of a semiconductor wafer. OPC structures are understood to mean for example structures designated by serifes or hammerheads, likewise including the targeted alteration of linewidths or the addition of fine structure elements (scattering bars) that lie below the resolution limit of the exposure apparatus.

In order to be able to determine the targeted alteration of the structure elements that is to be used, the circuit pattern is usually calculated during the photolithographic projection onto the resist structure in a simulation program. Since the selection or determination of size and form of the OPC structures is not the subject matter of the invention, the exemplary embodiment in accordance with FIG. 1 shows only a part of the method that is used for determining OPC structures. The steps start 10 and end 15 of the method are usually incorporated into a program that serves for selection and calculation of the OPC structures and comprises the method according to the invention in a type of subroutine.

In a first method step 20, provision is made of the calibration pattern for the filter function (also referred to as pupil filter). The data of a layout program, for example, may be used for this purpose. It contains structures whose diffraction patterns scan the lens pupil, e.g. line/gap patterns of different periodicity in respectively different orientation.

In a second step 22, the simulation model is provided. In this case, the simulation model may comprise a simulation with a plurality of coupled parameters (so-called lumped element program that is executed with scaled defocus scalar or scaled defocus vector image models). However, it is provided within the scope of the invention that any other scalar or vectorial simulation model can be used.

In the third step 24, a filter function is provided. The filter function comprises one or more fit parameters that characterize the usually two-dimensional filter function. The filter function may be executed for example in the form of a Gaussian function. In this case, the half value width would be a suitable fit parameter. The filter function may also be present as a higher-order polynomial or generally as a two-dimensional numerical matrix.

If necessary, in a further step 26, the required fit parameters are provided, to be precise normally at the start of the calibration based on experience or in the course of optimization with altered parameters in accordance with the fit method, which itself is not the subject matter of the invention. During a simulation 28 of the photolithographic projection of the circuit pattern onto the substrate of the semiconductor wafer, a Fourier transformation is usually used in an intermediate step, so that the filter function must likewise be present in the Fourier plane. A frequency-dependent intensity loss can be calculated by multiplying the intensity distribution in the Fourier space by the filter function. This is particularly important during the calculation with a two-dimensional model since effects such as e.g. the oblique incidence of light in the projection apparatus depend both on the polarization and on the order of diffraction of the light. Marginal rays that are present in a higher order of diffraction are usually attenuated as a result. These effects are taken into account by the filter function. It should be mentioned at this point that the filter function is of nonphysical nature. The simulation beset by errors produces a simulation result beset by errors, which is corrected by the filter function. The actual frequency-dependent transmission profile of the projection optical arrangement is in reality smaller for marginal rays than the value described by the filter function.

A calculation 30 of the intensity distribution in the resist plane is subsequently carried out. The calibration pattern provided in the first step 20 is generally used for carrying out an exposure 32 of a semiconductor wafer with a resist layer, it being possible for the dimensions of the structure elements of the circuit pattern subsequently to be determined by measurement 34 of the exposed and developed resist layer. The measurement of the structure elements may be carried out for example by a scanning electron microscope.

By comparison 36, the measured resist structure and the resist structure calculated from the simulated intensity profile can be checked for differences. If, in interrogation 38, the differences are small or tolerable, the method according to the invention is ended; otherwise, the fit parameter or fit parameters is or are altered by modification 40.

The modified fit parameters are again provided for the simulation model in the further process step 26. By multiple comparison, it is possible to adapt the simulation result of the measured resist structure. It is thus possible to obtain a good correspondence between measured and simulated resist structure by means of a simple two-dimensional simulation model.

However, it is provided within the scope of the invention to provide, instead of the measured resist structure, a more exactly simulated resist structure in an alternative process step 42, which resist structure is used for the comparison with the simulation result. In this case, the simulated resist structure may be provided for example by a simulator that takes account of three-dimensional effects. By way of example, simulators are known which can calculate three-dimensional mask effects such as e.g. diffraction and near field effects at the mask. Moreover, with these simulators it is possible to be able to calculate the angle dependence of the light reflection at the resist surface.

Furthermore, it is provided within the scope of the invention to determine the values for the fit parameter or fit parameters empirically, for example from experimental values of earlier calibrations taking account of the transmission differences of the earlier lenses present in the concrete application.

The crucial advantage of the invention is based on obtaining a very high accuracy using a simulation model that is relatively simple and can thus be executed rapidly. The following example shows, on the basis of measured simulation times, that a simulator that uses very accurate models is not suitable for large-area calculations. By way of example, a simulation duration of 1360 s was observed at 0.04 µm using a three-dimensional transfer matrix model (for example provided by the simulator solid C from the company Sigma-C) for a measurement window of 0.04 µm. If the method according to the invention is used, however, the simulation time is only 120 s. In order to determine OPC structures, chip areas of a few hundred square micrometers are often calculated. The simulation using an accurate simulation model would take up a number of days or years. With the aid of the method according to the invention, however, these calculations can be carried out in a few hours without being able to ascertain noticeable losses of accuracy.

The accuracy that can be achieved with the method according to the invention will be demonstrated below on the basis of an example. FIG. 2 shows a linearity diagram illustrating the dependence of the linewidth $CD_{Wafer}$ of a line-gap pattern on the wafer on the linewidth $CD_{Mask}$ on the mask. On the mask, the linewidth and the width of the gap are chosen to be identical in each case. The values specified relate to differing periodicity of the line-gap pattern.

The first curve 50 shows the dimensions of the line-gap pattern obtained by measurement after the circuit pattern was transferred to a wafer. It is evident that the linewidths $CD_{Wafer}$ actually obtained depend significantly non-linearly on the linewidth $CD_{Mask}$ of the mask particularly in the region of the resolution limit. This nonlinearity is an important property of the lithographic process which has to be correctly described for example in the determination of the OPC structures.

Curve 52 shows the simulation using a simple model that is the starting point of the method according to the invention. It is evident that, in particular, the nonlinearity is not described adequately. Curve 54 shows the simulation result of the three-dimensional simulation model. It is evident that an approximately realistic linearity was simulated in that case. The fourth curve 56 shows the simulation result that was realized by means of the method according to the invention. A Gaussian function was assumed for the filter function, the fit parameter having been fitted to the measured values during calibration. It is evident that the method according to the invention achieves the best correspondence to the measured values.

The method according to the invention can easily be integrated into simulation models of different manufacturers of simulation programs. The optissimo simulator from the company PDF-Solutions or the calibre simulator from the company Mentor Graphics shall be cited here as examples.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Symbols
10 Start
15 End
20 First step
22 Second step
24 Third step
26 Further step
28 Simulation
30 Calculation
32 Exposure
34 Measurement
36 Comparison
38 Interrogation
40 Modification
42 Alternative process step
50 First curve
52 Second curve
54 Third curve
56 Fourth curve

What is claimed:
1. A method for improving a photolithographic simulation of the projection of a pattern of structure elements formed on a photomask onto a substrate comprising:
   providing a pattern of structure elements;
   providing a simplifying simulation model that describes the physical or chemical processes during lithography with an exposure apparatus without taking account of frequency-dependent transmissions of different orders of diffraction;
   executing a simulation of the projection of the pattern onto a resist layer applied on a substrate of a semiconductor wafer in the exposure apparatus for the purpose of forming a patterned resist layer with the simulation model;

calculating an intensity distribution in the substrate plane in a two-dimensional simulation of the imaging of the pattern with calculation of an intensity distribution in the Fourier space;

providing a two-dimensional filter function;

calculating a frequency-dependent intensity loss that occurs during the execution of a simulation of the pattern by multiplication of the intensity distribution in the Fourier space by the filter function in order to achieve a matching of the simulation result of the simulation model with a more exact simulation that takes account of the frequency-dependent transmission of different orders of diffraction; and optimizing the geometry of the structure elements of the pattern and/or parameters of the lithographic projection in order to achieve an improved dimensional accuracy for subsequent imagings.

2. The method of claim 1, wherein the simulation of the projection of the pattern is effected on the basis of a model with a plurality of coupled parameters.

3. The method of claim 1, further comprising:

lithographic patterning of the semiconductor wafer with the pattern by means of the exposure apparatus in order to form a resist structure; and measuring the resist structure;

wherein the filter function is executed such that it has at least one fit parameter, the at least one fit parameter being chosen such that simulated structure elements correspond to the measured resist structure.

4. The method of claim 3, wherein the filter function comprises a Gaussian function, the half value width of the Gaussian function corresponding to the fit parameter and being determined by measurement of the patterned resist layer.

5. The method of claim 1, wherein the filter function is executed such that it has at least one fit parameter, the at least one fit parameter of the filter function being determined empirically.

6. The method of claim 1, wherein the filter function is determined by means of a simulated resist structure.

7. The method of claim 6, wherein the angle dependence of the light reflection at a resist surface of the resist layer is calculated during the determination of the simulated resist structure with a transfer matrix model.

8. The method of claim 6, wherein the diffraction and near field effects at the photomask are calculated during the determination of the simulated resist structure with a three-dimensional model.

9. The method of claim 1, wherein the calculated intensity distribution is used for determining OPC structures of a circuit pattern in the simulation.

10. The method of claim 1, wherein a line-gap pattern having a different periodicity in different directions is provided during the step of providing the pattern.

* * * * *